US012580525B2

(12) United States Patent
Chang

(10) Patent No.: US 12,580,525 B2
(45) Date of Patent: Mar. 17, 2026

(54) TRANSMISSION DEVICE AND SIGNAL PREDISTORTION METHOD THEREOF

(71) Applicant: Realtek Semiconductor Corporation, Hsinchu (TW)

(72) Inventor: Yuan-Shuo Chang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 326 days.

(21) Appl. No.: 18/347,566

(22) Filed: Jul. 6, 2023

(65) Prior Publication Data

US 2024/0030963 A1 Jan. 25, 2024

(30) Foreign Application Priority Data

Jul. 20, 2022 (TW) .................................. 111127237

(51) Int. Cl.
*H03F 1/32* (2006.01)
*H04B 1/04* (2006.01)

(52) U.S. Cl.
CPC ............. *H03F 1/3247* (2013.01); *H04B 1/04* (2013.01); *H04B 1/0475* (2013.01); *H04B 2001/0425* (2013.01)

(58) Field of Classification Search
CPC .................... H04B 1/0475; H04B 1/04; H04B 2001/0408; H04B 2001/0425; H04B 1/02; H04B 1/62; H03F 1/3247
See application file for complete search history.

(56) References Cited

U.S. PATENT DOCUMENTS

| | | | | |
|---|---|---|---|---|
| 6,298,097 B1 * | 10/2001 | Shalom | ................. | H03F 1/3294 |
| | | | | 375/296 |
| 7,583,754 B2 * | 9/2009 | Liu | ....................... | H03F 1/3247 |
| | | | | 375/295 |
| 2011/0092173 A1 | 4/2011 | McCallister et al. | | |

FOREIGN PATENT DOCUMENTS

| | | | | |
|---|---|---|---|---|
| CN | 108134584 B | * | 9/2021 | ........... H03F 1/3247 |

OTHER PUBLICATIONS

Lei Ding et al., "A robust digital baseband predistorter constructed using memory polynomials," in IEEE Transactions on Communications, vol. 52, No. 1, pp. 159-165, Jan. 2004, doi:10.1109/TCOMM. 2003.822188.

* cited by examiner

*Primary Examiner* — Betsy Deppe
(74) *Attorney, Agent, or Firm* — CKC & Partners Co., LLC

(57) ABSTRACT

A signal predistortion method applied to a transmission device. The transmission device includes a signal processing circuit, a transmission chain and a power amplifier, the power amplifier is configured to amplify a radio-frequency (RF) input signal outputted by the transmission chain to generate a RF output signal. The signal predistortion method includes: performing a first signal processing operation on a baseband signal by the signal processing circuit, to generate an in-band predistortion output; performing a second signal processing operation on the in-band predistortion output by the signal processing circuit, to generate an out-of-band predistortion output; and generating a full-band predistortion signal to the transmission chain according to the in-band predistortion output and the out-of-band predistortion output by the signal processing circuit, so that the transmission chain generates the RF input signal according to the full-band predistortion signal.

18 Claims, 10 Drawing Sheets

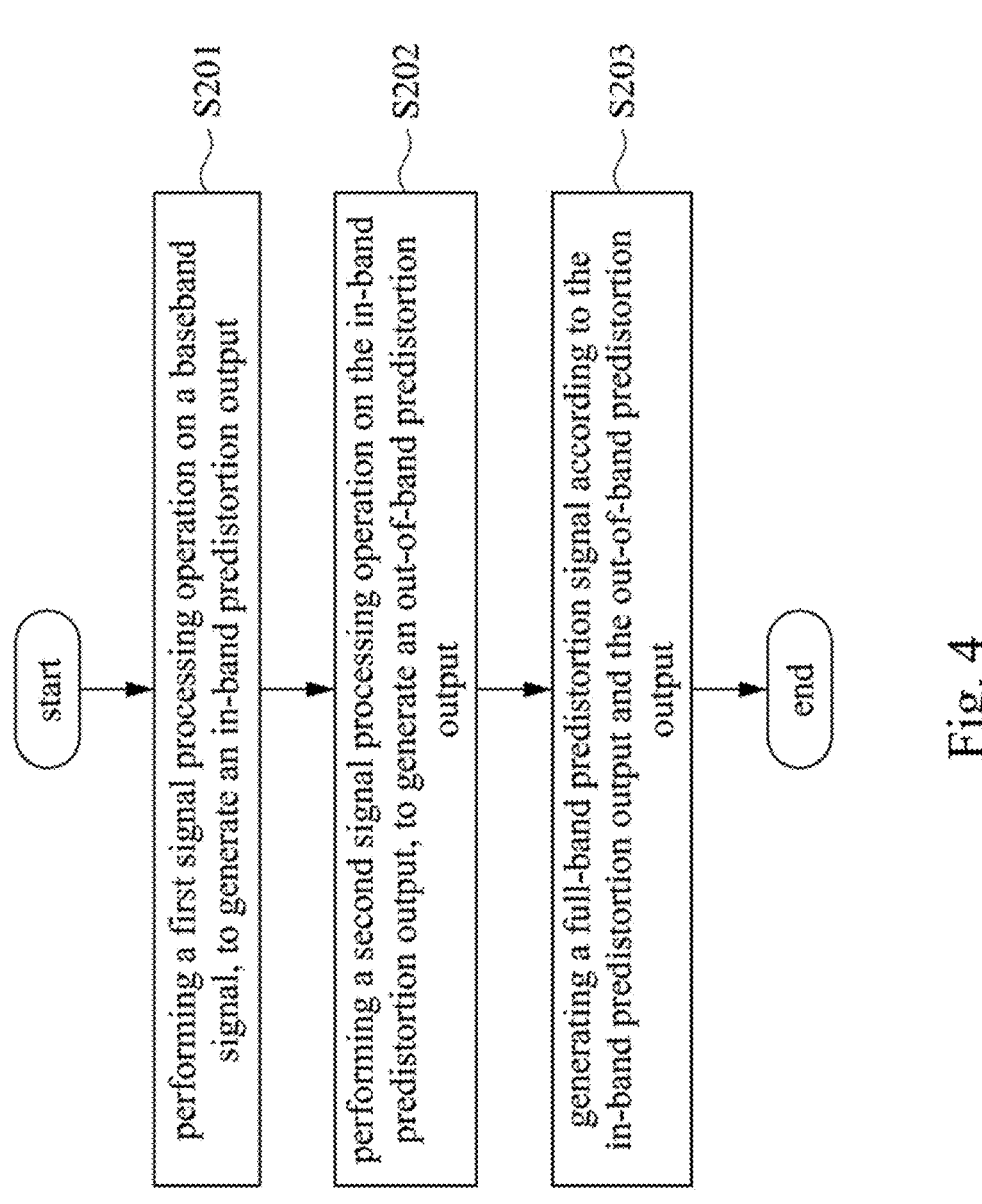

200

S201 performing a first signal processing operation on a baseband signal, to generate an in-band predistortion output

S202 performing a second signal processing operation on the in-band predistortion output, to generate an out-of-band predistortion output

S203 generating a full-band predistortion signal according to the in-band predistortion output and the out-of-band predistortion output start end

Fig. 4

TRANSMISSION DEVICE AND SIGNAL PREDISTORTION METHOD THEREOF

CROSS-REFERENCE TO RELATED APPLICATION

This application claims priority to Taiwan Application Serial Number 111127237, filed Jul. 20, 2022, which is herein incorporated by reference in its entirety.

BACKGROUND

Field of Invention

This disclosure relates to an electronic device, and in particular to a transmission device and signal predistortion method thereof.

Description of Related Art

In order to compensate the energy loss in the transmission process, current wireless transmission devices usually utilize the radio-frequency (RF) power amplifier to preamplify signals. Because the RF power amplifier is a non-linear unit, the signals amplified by the power amplifier may have problems of in-band distortion and growth in out-of-band components (e.g., intermodulation product), which results in adjacent channel interference. For the above problems, nowadays most approaches use the technology of digital predistortion to compensate the signals before the signals is inputted into the power amplifier.

However, as the signal transmission bandwidth gets larger, the power amplifier also introduces memory effect in addition to causing the above problems. The signals may have different compensation amount at different frequencies under the influence of memory effect, which causes the transmission device to spend huge computation resources to implement complicated predistortion process. In addition, the transmission device further needs to calculate parameters suitable for the predistortion process. In the process of calculating the parameters, it may have problems of unstable numerical convergence, which results in bad performance of cancelling out-of-band components.

SUMMARY

An aspect of present disclosure relates to a signal predistortion method applied to a transmission device. The transmission device includes a signal processing circuit, a transmission chain and a power amplifier, the power amplifier is configured to amplify a radio-frequency (RF) input signal outputted by the transmission chain to generate a RF output signal. The signal predistortion method includes: performing a first signal processing operation on a baseband signal by the signal processing circuit, to generate an in-band predistortion output; performing a second signal processing operation on the in-band predistortion output by the signal processing circuit, to generate an out-of-band predistortion output; and generating a full-band predistortion signal to the transmission chain according to the in-band predistortion output and the out-of-band predistortion output by the signal processing circuit, so that the transmission chain generates the RF input signal according to the full-band predistortion signal.

Another aspect of present disclosure relates to a transmission device. The transmission device includes a signal processing circuit, a transmission chain and a power amplifier. The signal processing circuit includes an in-band predistortion circuit, an out-of-band predistortion circuit and a first computation circuit. The in-band predistortion circuit is configured to perform a first signal processing operation on a baseband signal, to generate an in-band predistortion output. The out-of-band predistortion circuit is configured to perform a second signal processing operation on the in-band predistortion output, to generate an out-of-band predistortion output. The first computation circuit is configured to generate a full-band predistortion signal according to the in-band predistortion output and the out-of-band predistortion output. The transmission chain is configured to generate a radio-frequency (RF) input signal according to the full-band predistortion signal. The power amplifier is configured to amplify the RF input signal to generate a RF output signal.

BRIEF DESCRIPTION OF THE DRAWINGS

FIG. 4 is a flow diagram of a signal predistortion method in accordance with some embodiments of the present disclosure;

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
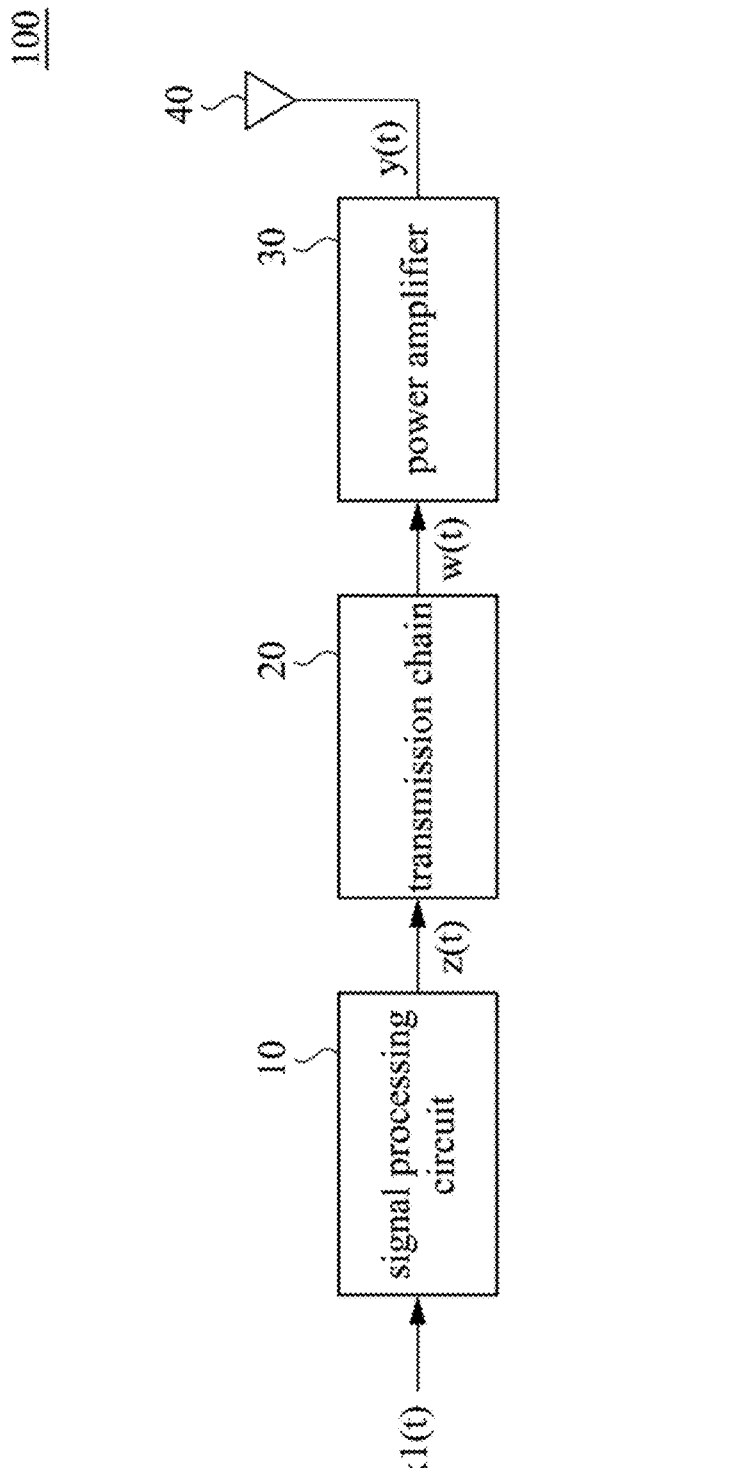
FIG. 1 is a block diagram of a transmission device in accordance with some embodiments of the present disclosure.

Referring to FIG. 1, FIG. 1 is a block diagram of a transmission device 100 in accordance with some embodiments of the present disclosure. In some embodiments, the transmission device 100 includes a signal processing circuit a transmission chain 20, a power amplifier 30 and an antenna 40.

As shown in FIG. 1, the signal processing circuit 10 is configured to receive a baseband signal x1($t$) and is configured to perform a signal processing operation on the baseband signal x1($t$), to generate a full-band predistortion signal z(t) to the transmission chain 20. An input terminal and an output terminal of the transmission chain 20 are coupled to the signal processing circuit 10 and the power amplifier 30 respectively, and the transmission chain 20 is configured to generate a radio-frequency (RF) input signal w (t) to the power amplifier 30 according to the full-band predistortion signal z(t). An input terminal and an output terminal of the power amplifier 30 are coupled to the transmission chain 20 and the antenna 40 respectively, and the power amplifier 30 is configured to amplify the RF input signal w(t) to generate a RF output signal y(t) to the antenna 40, so as to transmit message. It can be appreciated that "t" represents time.

Figure 2:
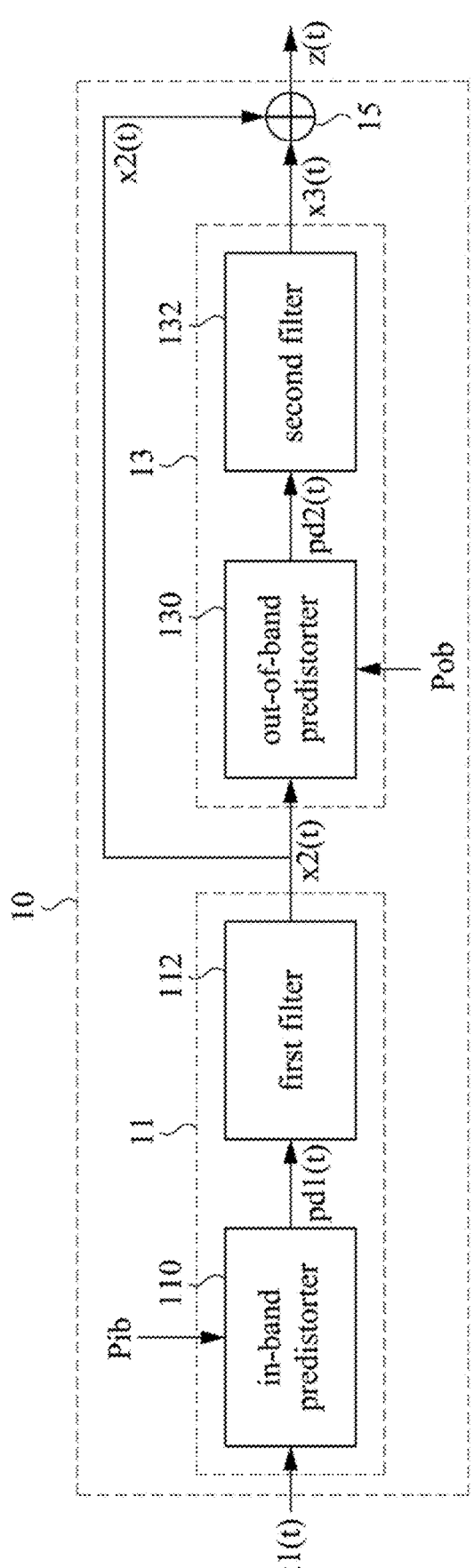
FIG. 2 is a block diagram of a signal processing circuit in accordance with some embodiments of the present disclosure.

The signal processing circuit 10 would be described in detail below with reference to FIG. 2. Referring to FIG. 2, FIG. 2 is a block diagram of the signal processing circuit 10 in accordance with some embodiments of the present disclosure. In some embodiments, the signal processing circuit 10 includes an in-band predistortion circuit 11, an out-of-band predistortion circuit 13 and a first computation circuit 15. The in-band predistortion circuit 11 is configured to receive the baseband signal x1($t$) and is configured to perform a first signal processing operation on the baseband signal x1($t$), to generate an in-band predistortion output x2($t$). An input terminal and an output terminal of the out-of-band predistortion circuit 13 are coupled to the in-band predistortion circuit 11 and the first computation circuit 15 respectively, and the out-of-band predistortion circuit 13 is configured to perform a second signal processing operation on the in-band predistortion output x2($t$), to generate an out-of-band predistortion output x3($t$). The first computation circuit 15 is coupled to an output terminal of the in-band predistortion circuit 11 and the output terminal of the out-of-band predistortion circuit 13 to receive the in-band predistortion output x2($t$) and the out-of-band predistortion output x3($t$) respectively and is configured to generate the full-band predistortion signal z(t) according to the in-band predistortion output x2($t$) and the out-of-band predistortion output x3($t$).

In some embodiments, as shown in FIG. 2, the in-band predistortion circuit 11 includes an in-band predistorter 110 and a first filter 112. The in-band predistorter 110 is configured to perform an in-band predistortion process on the baseband signal x1($t$) according to an in-band predistortion parameter set Pib, to generate a first predistortion output pd1($t$). The first filter 112 is coupled to an output terminal of the in-band predistorter 110 and is configured to perform a first filtering process on the first predistortion output pd1($t$), to generate the in-band predistortion output x2($t$).

In particular, the in-band predistorter 110 is mainly configured to compensate in-band predistortion caused by the non-linear characteristic of the power amplifier 30, and the in-band predistortion process can be implemented by algorithms applying the technology of indirect learning architecture and least square method. The first predistortion output pd1($t$) includes at least one first in-band predistortion compensation term and at least one first out-of-band predistortion compensation term to compensate in-band distortion and out-of-band components grown due to the non-linear characteristic of the power amplifier 30. The first in-band predistortion compensation term in the first predistortion output pd1($t$) can compensate the in-band distortion effectively. However, the first out-of-band predistortion compensation term in the first predistortion output pd1($t$) is prone to be incorrect due to the poor numerical convergence, which results in poor performance of cancelling out-of-band components. Accordingly, the signal processing circuit 10 of the present disclosure uses the first filter 112 to filter out the first out-of-band predistortion compensation term in the first predistortion output pd1($t$), so as to generate the in-band predistortion output x2($t$), in which the first filter 112 can be implemented by a low-pass filter, and the first filtering process can be a low-pass filtering process. Notably, the in-band predistortion output x2($t$) can compensate the in-band distortion effectively, so that signals outputted by the power amplifier 30 can have better error vector magnitude within the in-band range.

In some embodiments, as shown in FIG. 2, the out-of-band predistortion circuit 13 includes an out-of-band predistorter 130 and a second filter 132. The out-of-band predistorter 130 is configured to perform an out-of-band predistortion process on the in-band predistortion output x2($t$) according to an out-of-band predistortion parameter set Pob, to generate a second predistortion output pd2($t$). The second filter 132 is coupled to an output terminal of the out-of-band predistorter 130 and is configured to perform a second filtering process on the second predistortion output pd2($t$), to generate the out-of-band predistortion output x3($t$).

In particular, the out-of-band predistorter 130 is mainly configured to compensate out-of-band distortion (e.g., out-of-band components) caused by the non-linear characteristic of the power amplifier 30, and the out-of-band predistortion process can be implemented by algorithms. Similar to the first predistortion output pd1($t$), the second predistortion output pd2($t$) includes at least one second in-band predistortion compensation term and at least one second out-of-band predistortion compensation term. The second out-of-band predistortion compensation term in the second predistortion output pd2($t$) can cancel the out-of-band components. In addition, the second in-band predistortion compensation term in the second predistortion output pd2($t$) is nearly the term which is derived from the first in-band predistortion compensation term in the first predistortion output pd1($t$), therefore in-band distortion cannot be reduced effectively. Accordingly, the signal processing circuit 10 of the present disclosure uses the second filter 132 to filter out the second in-band predistortion compensation term in the second predistortion output pd2($t$), so as to generate the out-of-band predistortion output x3($t$), in which the second filter 132 can be implemented by a high-pass filter, and the second filtering process can be a high-pass filtering process.

In some embodiments, as shown in FIG. 2, the signal processing circuit 10 performs a signal synthesis process on the in-band predistortion output x2($t$) and the out-of-band predistortion output x3($t$) by the first computation circuit 15, to generate the full-band predistortion signal z(t). It can be seen from above descriptions that the full-band predistortion signal z(t) includes the first in-band predistortion compensation term in the first predistortion output pd1($t$) and the second out-of-band predistortion compensation term in the second predistortion output pd2($t$), and therefore can compensate both in-band distortion and out-of-band distortion effectively.

Figure 3:
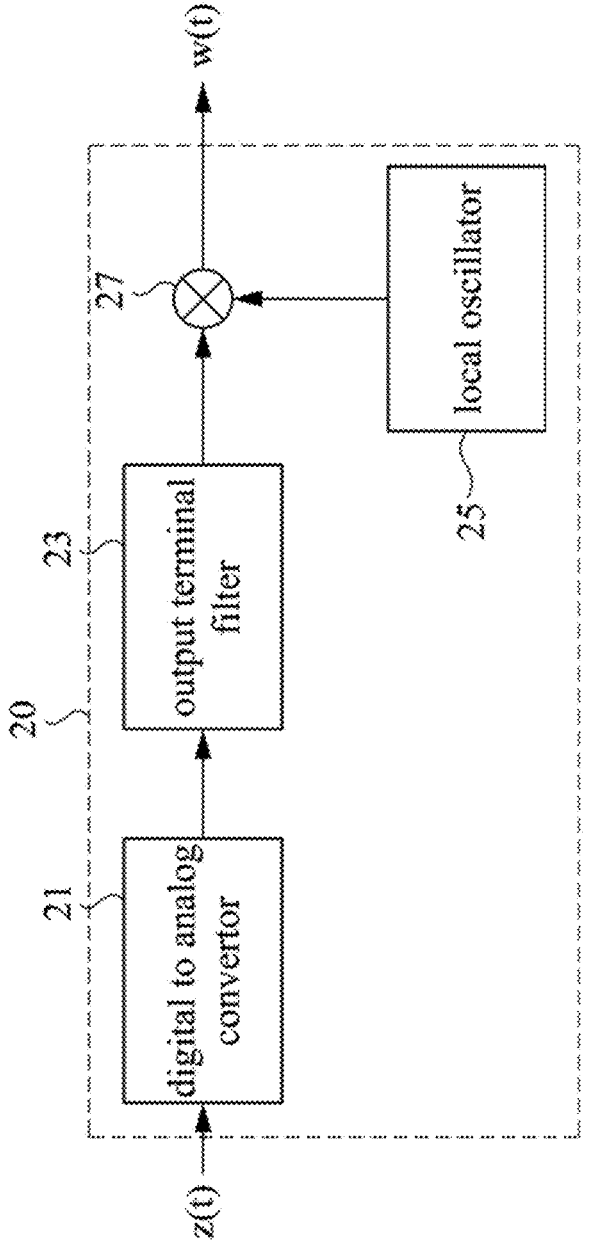
FIG. 3 is a block diagram of a transmission chain in accordance with some embodiments of the present disclosure.

The transmission chain 20 would be described in detail below with reference to FIG. 3. Referring to FIG. 3, FIG. 3 is a block diagram of the transmission chain 20 in accordance with some embodiments of the present disclosure. In some embodiments, the transmission chain 20 includes a digital to analog convertor 21, an output terminal filter 23, a local oscillator 25 and a mixer 27. The digital to analog convertor 21 is configured to receive the full-band predistortion signal z(t) and is configured to perform a digital to analog converting operation on the full-band predistortion signal z(t), to convert the full-band predistortion signal z(t) from a digital form into an analog form. The output terminal filter 23 is configured to perform a filtering process on the full-band predistortion signal z(t) with the analog form. The local oscillator 25 and the mixer 27 are configured to modulate the full-band predistortion signal z(t) outputted by the output terminal filter 23, to generate the RF input signal w(t) to the power amplifier 30. Notably, the RF input signal w(t) generated according to the full-band predistortion signal z(t) can compensate in-band distortion and out-of-band distortion caused by the non-linear characteristic of the power amplifier 30, so that the power amplifier 30 can generate fine RF output signal y(t) to the antenna 40.

Referring to FIG. 4, FIG. 4 is a flow diagram of a signal predistortion method 200 in accordance with some embodiments of the present disclosure. The signal predistortion method 200 can be executed by the signal processing circuit 10 as shown in FIG. 1 or 2, to generate signals capable of compensating in-band distortion and out-of-band distortion caused by the non-linear characteristic of the power amplifier 30. In some embodiments, as shown in FIG. 4, the signal predistortion method 200 includes steps S201-S203. For convenience and clarity of description, the signal predistortion method 200 would be described in detail below with reference to FIG. 2.

In step S201, the signal processing circuit 10 performs the first signal processing operation on the baseband signal x1($t$) by the in-band predistortion circuit 11, to generate the in-band predistortion output x2($t$). It can be appreciated that the first signal processing operation includes the in-band predistortion process performed by the in-band predistorter 110 and the first filtering process performed by the first filter 112. The descriptions of the in-band predistortion process and the first filtering process are same or similar to those of the above embodiments, and therefore are omitted herein.

In step S202, the signal processing circuit 10 performs the second signal processing operation on the in-band predistortion output x2($t$) by the out-of-band predistortion circuit 13, to generate the out-of-band predistortion output x3($t$). It can be appreciated that the second signal processing operation includes the out-of-band predistortion process performed by the out-of-band predistorter 130 and the second filtering process performed by the second filter 132. The descriptions of the out-of-band predistortion process and the second filtering process are same or similar to those of the above embodiments, and therefore are omitted herein.

In step S203, the signal processing circuit 10 generates the full-band predistortion signal z(t) according to the in-band predistortion output x2($t$) and the out-of-band predistortion output x3($t$). The operation of generating the full-band predistortion signal z(t) is same or similar to those of the above embodiments, and therefore are omitted herein.

In the above embodiments, as shown in FIG. 2, the in-band predistortion parameter set Pib and the out-of-band predistortion parameter set Pob can be prestored in storage (e.g., memory) of the transmission device 100, and the signal processing circuit 10 can access the in-band predistortion parameter set Pib and the out-of-band predistortion parameter set Pob from the storage when performing related operations. However, the present disclosure is not limited herein. For example, in some embodiments, the signal processing circuit 10 is further configured to generate the in-band predistortion parameter set Pib and the out-of-band predistortion parameter set Pob.

Figure 5:
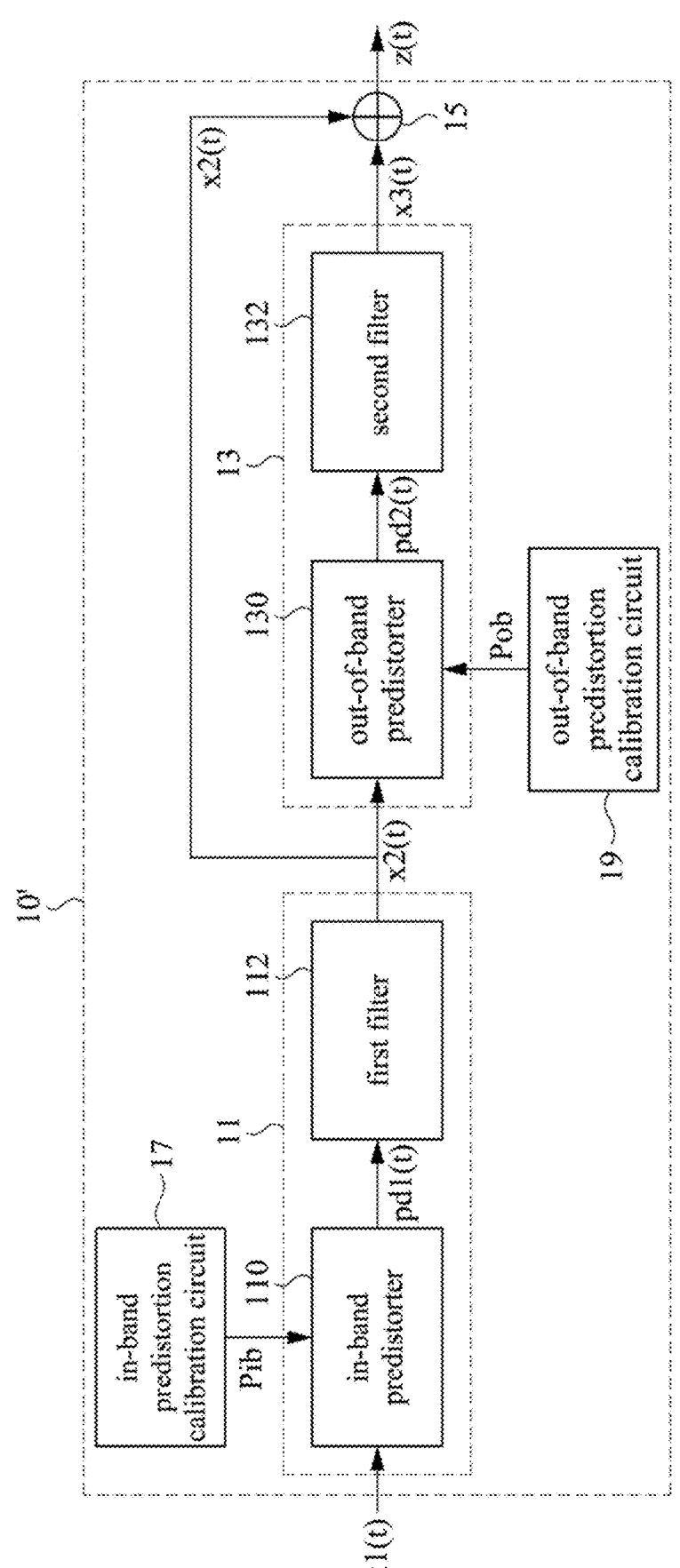
FIG. 5 is a block diagram of a signal processing circuit in accordance with some embodiments of the present disclosure.

The operation of generating the in-band predistortion parameter set Pib and the out-of-band predistortion parameter set Pob would be described in detail below with reference to FIG. 5. Referring to FIG. 5, FIG. 5 is a block diagram of a signal processing circuit 10' in accordance with some embodiments of the present disclosure. In comparison to the signal processing circuit 10 as shown in FIG. 2, the signal processing circuit 10' of FIG. 5 further includes an in-band predistortion calibration circuit 17 and an out-of-band predistortion calibration circuit 19. In some embodiments, the signal processing circuit 10' is configured to generate the in-band predistortion parameter set Pib by the in-band predistortion calibration circuit 17 and is configured to generate the out-of-band predistortion parameter set Pob by the out-of-band predistortion calibration circuit 19. In the signal processing circuit 10' of FIG. 5, the components same as those in the signal processing circuit 10 of FIG. 2 are represented by same symbols, and the descriptions thereof are omitted herein.

Figure 6:
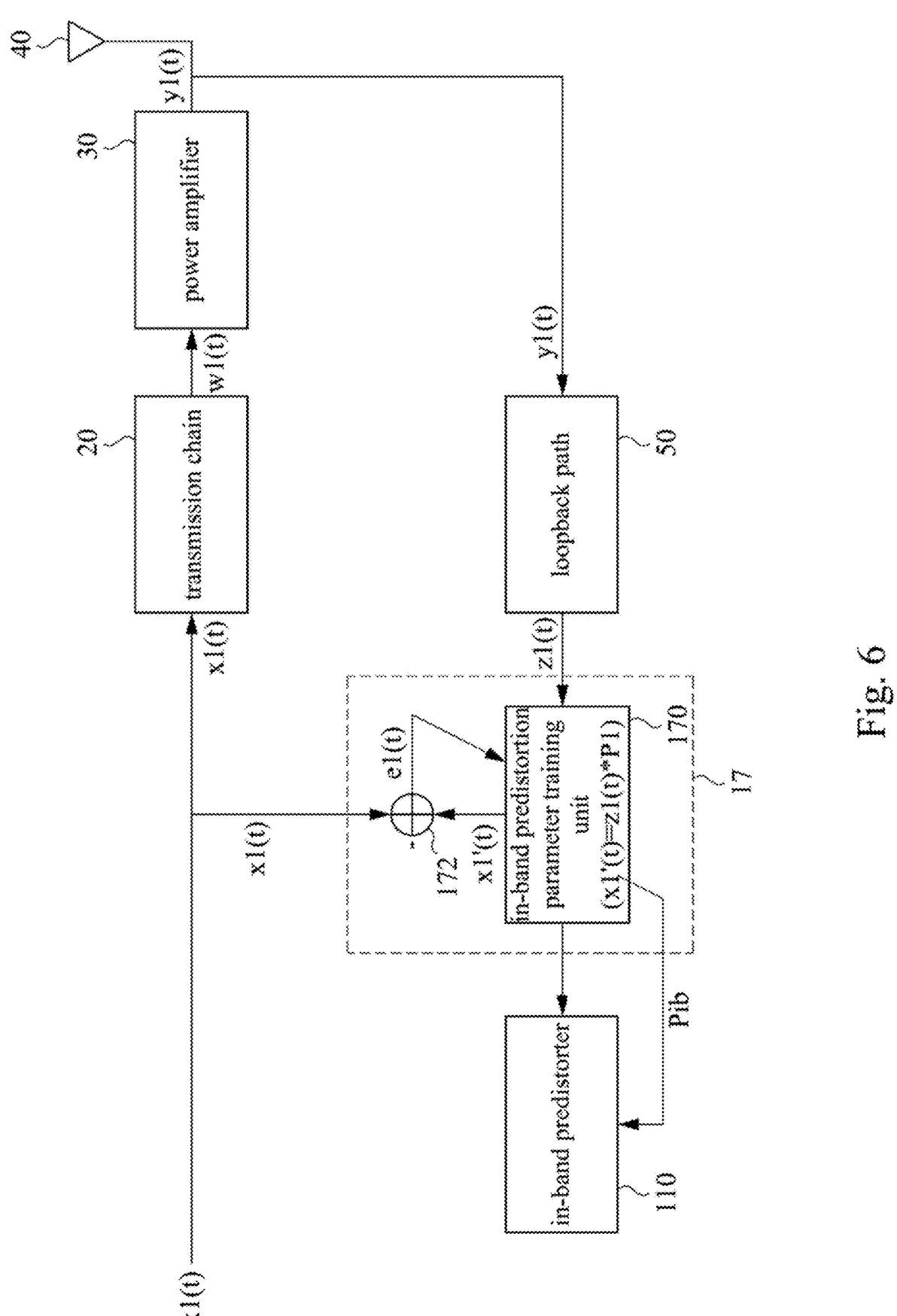
FIG. 6 is a schematic diagram of generating an in-band predistortion parameter set in accordance with some embodiments of the present disclosure.

The operation of generating the in-band predistortion parameter set Pib by the in-band predistortion calibration circuit 17 would be described in detail below with reference to FIG. 6. Referring to FIG. 6, FIG. 6 is a schematic diagram of generating the in-band predistortion parameter set Pib in accordance with some embodiments of the present disclosure. In some embodiments, as shown in FIG. 6, in order to generate the in-band predistortion parameter set Pib, the signal processing circuit 10 inputs the baseband signal x1($t$) into the transmission chain 20. The transmission chain 20 generates a first input signal w1($t$) according to the baseband signal x1($t$). For example, the transmission chain 20 performs the digital to analog converting operation, the filtering process and the modulating operation on the baseband signal x1($t$) sequentially, to generate the first input signal w1($t$). The power amplifier 30 amplifies the first input signal w1($t$) to generate a first output signal y1($t$).

Figure 7:
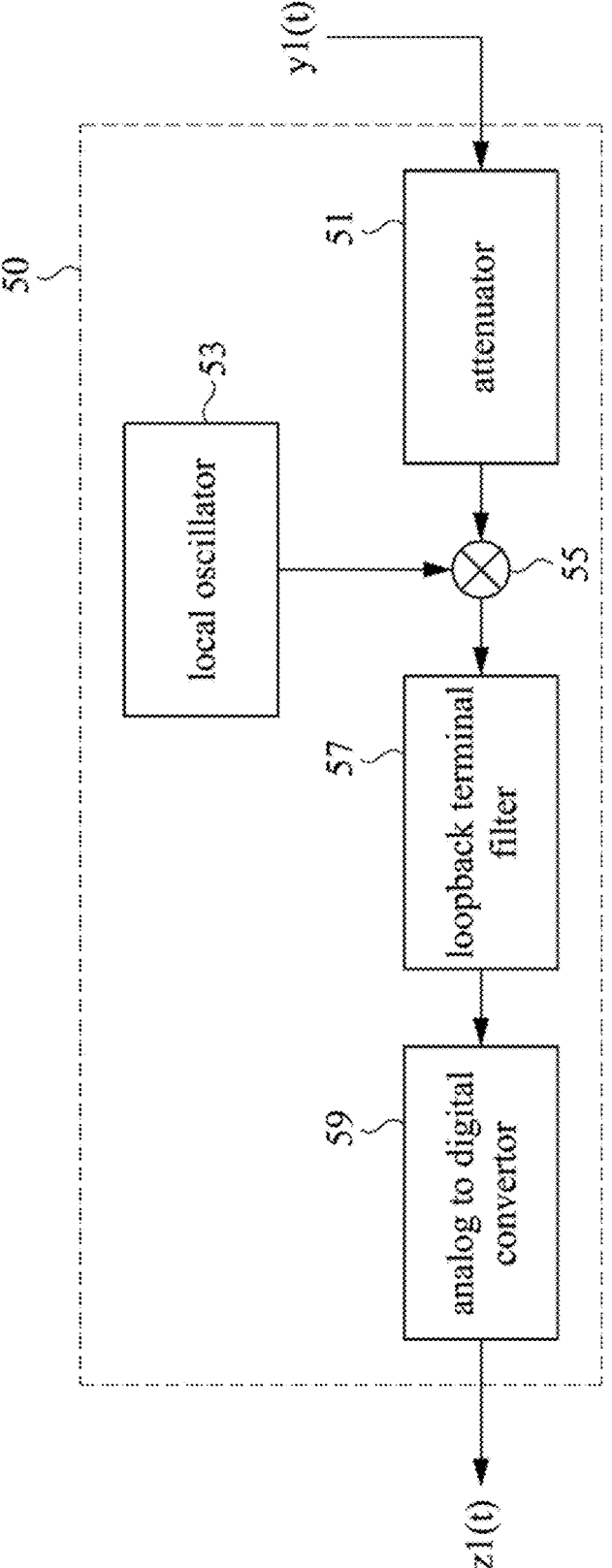
FIG. 7 is a block diagram of a loopback path in accordance with some embodiments of the present disclosure.

In some embodiments, as shown in FIG. 6, the transmission device 100 further includes a loopback path 50, an input terminal and an output terminal of the loopback path 50 are coupled to the power amplifier 30 and the in-band predistortion calibration circuit 17, and the loopback path 50 is configured to generate a first loopback signal z1($t$) according to the first output signal y1($t$). The loopback path 50 would be described in detail below with reference to FIG. 7. Referring to FIG. 7, FIG. 7 is a block diagram of the loopback path 50 in accordance with some embodiments of the present disclosure. In some embodiments, the loopback path 50 includes an attenuator 51, a local oscillator 53, a mixer 55, a loopback terminal filter 57 and an analog to digital convertor 59. The attenuator 51 is configured to receive the first output signal y1($t$) and is configured to attenuate the first output signal y1($t$). The attenuated first output signal y1($t$) is demodulated by the local oscillator 53 and the mixer 55, is filtered by the loopback terminal filter 57, and is converted from the analog form to the digital form by the analog to digital convertor 59, so as to generate the first loopback signal z1($t$). It can be appreciated that the local oscillator 53 in the loopback path 50 can be the same unit as the local oscillator 25 in the transmission chain 20.

In some embodiments, as shown in FIG. 6, the in-band predistortion calibration circuit 17 is configured to determine the in-band predistortion parameter set Pib according to the baseband single x1(*t*) and the first loopback signal z1(*t*). In particular, the in-band predistortion calibration circuit 17 includes an in-band predistortion parameter training unit 170 and a second computation circuit 172. The in-band predistortion parameter training unit 170 is configured to generate a first reference signal x1'(*t*) according to the first loopback signal z1(*t*) and a first reference parameter set P1. In some embodiments, the relationship of the first reference signal x1'(*t*), the first reference parameter set P1 and the first loopback signal z1(*t*) can be represented as following equation (1):

$$x1'(t)=a_0z1(t)+a_1z1(t)|z1(t)|^2+a_2z1(t)|z1(t)|^4 \tag{1},$$

where $a_0$, $a_1$ and $a_2$ are multiple parameters included by first reference parameter set P1.

In an ideal condition, it is desirable for the first reference signal x1'(*t*) to be the same as the baseband signal x1(*t*), so as to optimize the in-band predistortion process performed by the in-band predistorter 110. Accordingly, the second computation circuit 172 is configured to generate a first adjustment signal e1(*t*) to the in-band predistortion parameter training unit 170 based in a difference between the first reference signal x1'(*t*) and the baseband signal x1(*t*). The in-band predistortion parameter training unit 170 is further configured to modify the first reference parameter set P1 according to the first adjustment signal e1(*t*), so that the first reference signal x1'(*t*) approximates to the baseband signal x1(*t*). For example, the smaller the difference between the first reference signal x1'(*t*) and the baseband signal x1(*t*), the smaller the first adjustment signal e1(*t*). The in-band predistortion parameter training unit 170 can continuously modify the first reference parameter set P1 by the least square method until the first adjustment signal e1(*t*) is minimized (e.g., approaching 0). After multiple modifications, the in-band predistortion parameter training unit 170 can use the first reference parameter set P1 which makes the first reference signal x1'(*t*) substantially equal to the baseband signal x1(*t*) as the in-band predistortion parameter set Pib, so as to provide the in-band predistortion parameter set Pib to the in-band predistorter 110.

Figure 8:
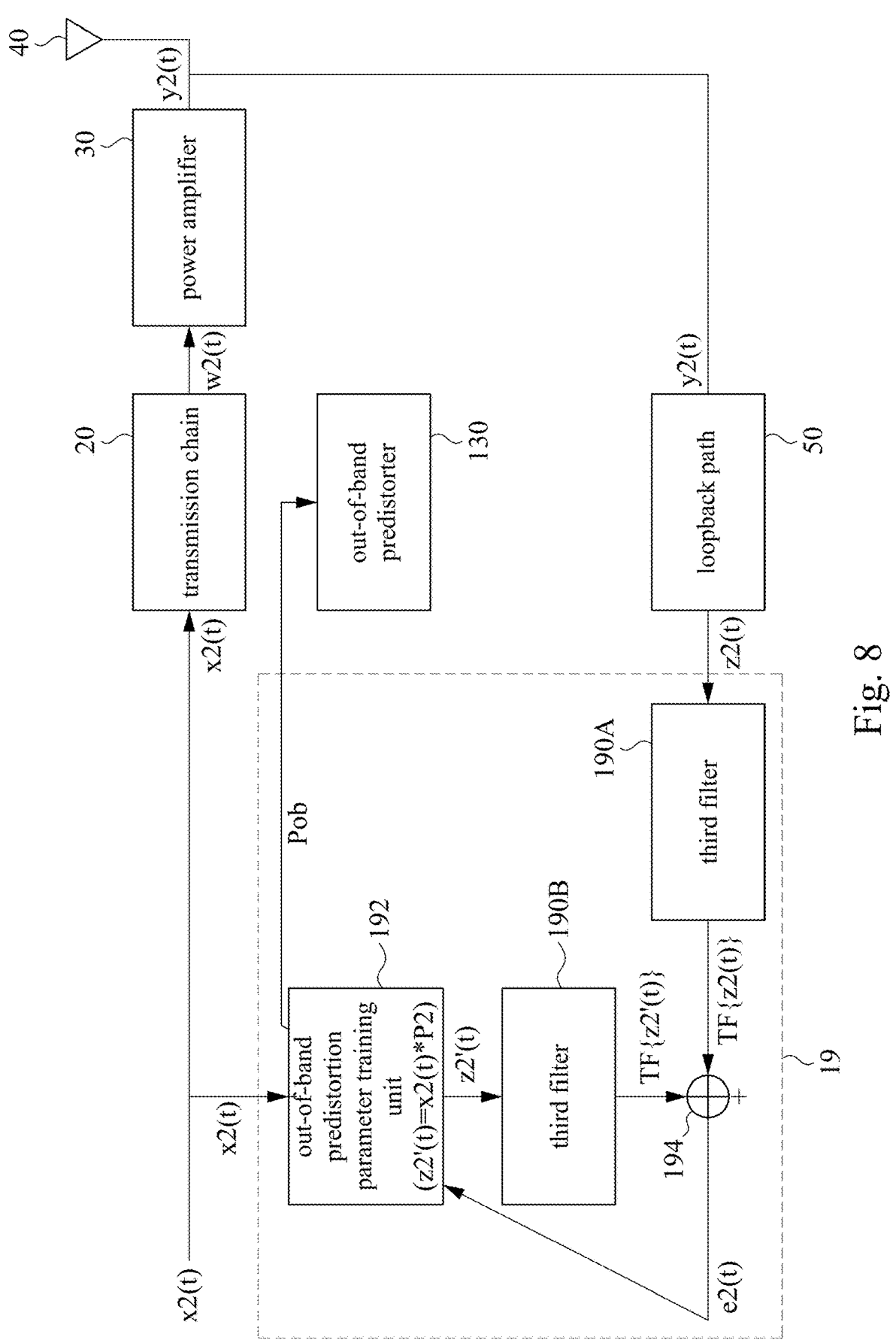
FIG. 8 is a schematic diagram of generating an out-of-band predistortion parameter set in accordance with some embodiments of the present disclosure.

The operation of generating the out-of-band predistortion parameter set Pob by the out-of-band predistortion calibration circuit 19 would be described in detail below with reference to FIG. 8. Referring to FIG. 8, FIG. 8 is a schematic diagram of generating the out-of-band predistortion parameter set Pob in accordance with some embodiments of the present disclosure. In some embodiments, as shown in FIG. 8, in order to generate the out-of-band predistortion parameter set Pob, the signal processing circuit 10 inputs the in-band predistortion output x2(*t*) into the transmission chain 20. The transmission chain 20 generates a second input signal w2(*t*) according to the in-band predistortion output x2(*t*). For example, the transmission chain 20 performs digital to analog conversion, filtering, and modulation to the in-band predistortion output x2(*t*) sequentially, to generate the second input signal w2(*t*). The power amplifier 30 amplifies the second input signal w2(*t*) to generate a second output signal y2(*t*).

In some embodiments, as shown in FIG. 8, the input terminal and the output terminal of the loopback path 50 are coupled to the power amplifier 30 and the out-of-band predistortion calibration circuit 19 respectively, and the loopback path 50 is configured to generate a second loopback signal z2(*t*) according to the second output signal y2(*t*). The operations that the loopback path 50 generates the second loopback signal z2(*t*) are same or similar to those of the above embodiments, and therefore are omitted herein.

In some embodiments, as shown in FIG. 8, the out-of-band predistortion calibration circuit 19 is configured to determine the out-of-band predistortion parameter set Pob according to the in-band predistortion output x2(*t*) and the second loopback signal z2(*t*). In particular, the out-of-band predistortion calibration circuit 19 includes multiple third filters 190A-190B, an out-of-band predistortion parameter training unit 192 and a third computation circuit 194. The out-of-band predistortion parameter training unit 192 is configured to generate a second reference signal z2'(t) according to the in-band predistortion output x2(*t*) and a second reference parameter set P2. In some embodiments, the relationship of the second reference signal z2'(t), the second reference parameter set P2 and the in-band predistortion output x2(*t*) can be represented as following equation (2):

$$z2'(t)=b_0x2(t)+b_1x2(t)|x2(t)|^2+b_2x2(t)|x2(t)|^4 \tag{2},$$

where $b_0$, $b_1$ and $b_2$ are multiple parameters included by the second reference parameter set P2.

The third filters 190A-190B are configured to perform a third filtering process on the second loopback signal z2(*t*) and the second reference signal z2'(*t*), to generate a filtered second loopback signal TF{z2(*t*)} and a filtered second reference signal TF{z2'(*t*)}, in which the third filters 190A-190B can be implemented by a high-pass filter, and the third filtering process can be a high-pass filtering process.

In an ideal condition, it is desirable for a sum of the filtered second loopback signal TF{z2(*t*)} and the filtered second reference signal TF{z2'(*t*)} to be as small as possible, so as to optimize the out-of-band predistortion process performed by the out-of-band predistorter 130. Accordingly, the third computation circuit 194 is configured to generate a second adjustment signal e2(*t*) to the out-of-band predistortion parameter training unit 192 according to the sum of the filtered second loopback signal TF{z2(*t*)} and the filtered second reference signal TF{z2'(*t*)}. The out-of-band predistortion parameter training unit 192 is configured to modify the second reference parameter set P2 according to the second adjustment signal e2(*t*), so as to minimize the second adjustment signal e2(*t*) (e.g., approaching 0). For example, the out-of-band predistortion parameter training unit 192 can generate a cost function (e.g., $J=\underline{e2}^H \underline{e2}$, where J is the cost function, and $\underline{e2}$ is the second adjustment signal e2(*t*) in a matrix form) according to the second adjustment signal e2(*t*) and utilize the least square method, the Newton-Raphson method or the least mean square method to minimize the cost function, to continuously modify the second reference parameter set P2. After multiple modifications, the out-of-band predistortion parameter training unit 192 can use the second reference parameter set P2 which makes the second adjustment signal e2(*t*) minimized as the out-of-band predistortion parameter set Pob, so as to provide the out-of-band predistortion parameter set Pob to the out-of-band predistorter 130.

Generally speaking, out-of-band components in output signals of the power amplifier 30 due to the non-linear characteristic of the power amplifier 30 would vary according to the in-band quality of input signals of the power amplifier 30. Notably, the signal processing circuit 10' of the present disclosure utilizes in-band components (that is, the in-band predistortion output x2(*t*)) in the full-band predistortion signal z(t) which will then pass through the transmission chain 20 and the power amplifier 30 to generate the out-of-band predistortion parameter set Pob. Therefore, the out-of-band predistortion process performed according to the out-of-band predistortion parameter set Pob by the out-of-band predistorter 130 can cancel out-of-band components.

In the above embodiments, the out-of-band predistortion calibration circuit 19 uses the third filters 190A-190B for filtering out in-band components in signals, because the out-of-band predistortion calibration circuit 19 mainly generates the out-of-band predistortion parameter set Pob by observing out-of-band components in signals. However, the present disclosure is not limited herein. In some embodiments, the third filters 190A-190B are omitted from the out-of-band predistortion calibration circuit 19. It can be appreciated that the out-of-band predistortion calibration circuit 19 can still generate the out-of-band predistortion parameter set Pob by observing out-of-band components in signals, even if it does not have the third filters 190A-190B.

Figure 9:
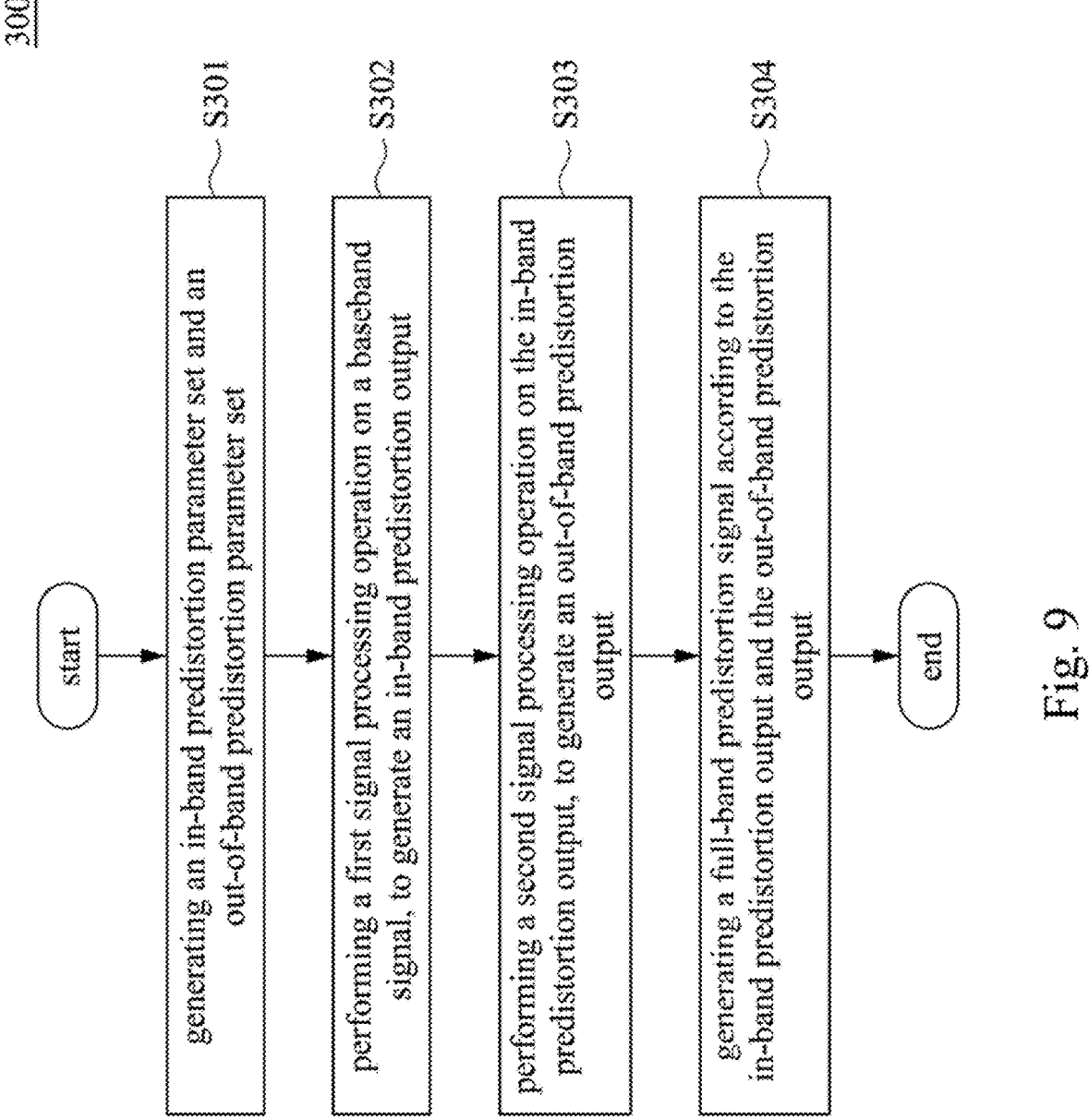
FIG. 9 is a flow diagram of a signal predistortion method in accordance with some embodiments of the present disclosure.

Referring to FIG. 9, FIG. 9 is a flow diagram of a signal predistortion method 300 in accordance with some embodiments of the present disclosure. The signal predistortion method 300 can be executed by the signal processing circuit 10' as shown in FIG. 5. In some embodiments, as shown in FIG. 9, the signal predistortion method 300 includes steps S301-S304. In step S301, the signal processing circuit 10' generates the in-band predistortion parameter set Pib and the out-of-band predistortion parameter set Pob. The operations of generating the in-band predistortion parameter set Pib and the out-of-band predistortion parameter set Pob are same or similar to those of the above embodiments, and therefore are omitted herein. In addition, steps S302-S304 are same or similar steps S201-S203 of FIG. 4, and therefore are omitted herein too.

It can be appreciated that the signal processing circuit 10' does not necessarily execute step S301 each time when the transmission device 100 needs to transmit message. In some embodiments, the signal processing circuit 10' can execute step S301 when the transmission device 100 is just booted up or just get connected.

Figure 10:
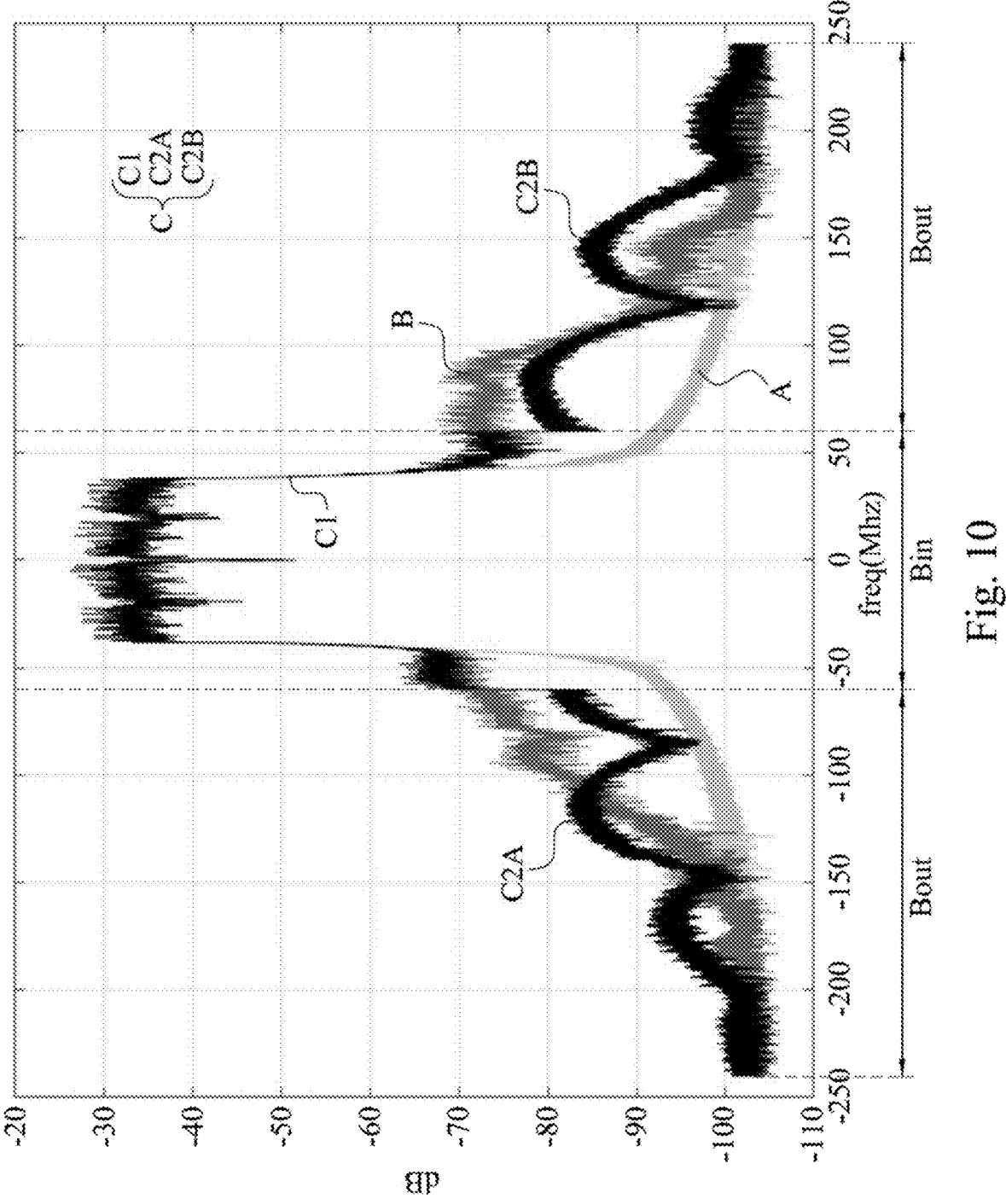
FIG. 10 is a schematic diagram of frequency spectrum of some signals in accordance with some embodiments of the present disclosure.

Referring to FIG. 10, FIG. 10 is a schematic diagram of frequency spectrum of some signals in accordance with some embodiments of the present disclosure. As shown in FIG. 10, curve A represents the frequency spectrum of the baseband signal x1(t). Curve B represents the frequency spectrum of the signal amplified by the power amplifier 30 without predistortion process. Curve C represents the frequency spectrum of the signal amplified by the power amplifier 30 with the in-band and out-band predistortion processes performed by the signal processing circuit 30, in which the curve C includes curve Cl within the in-band range Bin and curves C2A and C2B within the out-of-band range Bout. It can be seen from FIG. 10 that the curve C processed by the signal processing circuit 10 has better signal quality within the in-band range Bin, and the curve C processed by the signal processing circuit 10 has lower energy within the out-of-band range Bout.

In the above embodiments, when generating the full-band predistortion signal z(t), the signal processing circuit 10 first performs the in-band predistortion process by the in-band predistorter 110 and then performs the out-of-band predistortion process by the out-of-band predistorter 130. However, the present disclosure is not limited herein. In some embodiments, the signal processing signal 10 can first performs the out-of-band predistortion process by the out-of-band predistorter 130 and then performs the in-band predistortion process by the in-band predistorter 110, to generate the full-band predistortion signal z(t).

In the above embodiments, the signal processing circuit and its circuits can be implemented by one or more central processing unit (CPU), application-specific integrated circuit (ASIC), microprocessor, system on a Chip (SoC) or other suitable processing units.

It can be seen from the above embodiments of the present disclosure that the transmission device 100 of the present disclosure has the advantage of reduced computation dimension of digital predistortion by performing predistortion process on in-band signals and out-of-band signals separately. In addition, the transmission device 100 of the present disclosure has the advantage of reduced computational complexity and increased stability of numerical convergence by generating the in-band predistortion parameter set and the out-of-band predistortion parameter set separately.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A signal predistortion method applied to a transmission device, wherein the transmission device comprises a signal processing circuit, a transmission chain and a power amplifier, the power amplifier is configured to amplify a radio-frequency (RF) input signal outputted by the transmission chain to generate a RF output signal, and the signal predistortion method comprises:

performing, by the signal processing circuit, a first signal processing operation on a baseband signal and an in-band predistortion parameter set to generate an in-band predistortion output;

generating, by the signal processing circuit, the in-band predistortion parameter set according to a difference between a first reference signal and the baseband signal;

performing, by the signal processing circuit, a second signal processing operation on the in-band predistortion output to generate an out-of-band predistortion output; and generating, by the signal processing circuit, a full-band predistortion signal to the transmission chain according to the in-band predistortion output and the out-of-band predistortion output so that the transmission chain generates the RF input signal according to the full-band predistortion signal.

2. The signal predistortion method of claim 1, wherein the first signal processing operation comprises:

performing an in-band predistortion process on the baseband signal according to the in-band predistortion parameter set, to generate a first predistortion output; and performing a first filtering process on the first predistortion output, to generate the in-band predistortion output.

3. The signal predistortion method of claim 2, wherein the first filtering process is a low-pass filtering process.

4. The signal predistortion method of claim 2, wherein the transmission device further comprises a loopback path, and generating the in-band predistortion parameter set comprises:

inputting the baseband signal into the transmission chain, wherein the transmission chain generates a first input signal according to the baseband signal, the power amplifier amplifies the first input signal to generate a first output signal, and the loopback path generates a first loopback signal according to the first output signal; and determining the in-band predistortion parameter set according to the baseband signal and the first loopback signal.

5. The signal predistortion method of claim 4, wherein determining the in-band predistortion parameter set according to the baseband signal and the first loopback signal comprises:

generating the first reference signal according to the first loopback signal and a first reference parameter set;

generating a first adjustment signal based on the difference between the first reference signal and the baseband signal;

modifying the first reference parameter set according to the first adjustment signal, so that the first reference signal approximates to the baseband signal; and using the modified first reference parameter set making the first reference signal substantially equal to the baseband signal as the in-band predistortion parameter set.

6. The signal predistortion method of claim 1, wherein the second signal processing operation comprises:

performing an out-of-band predistortion process on the in-band predistortion output according to an out-of-band predistortion parameter set, to generate a second predistortion output; and performing a second filtering process on the second predistortion output, to generate the out-of-band predistortion output.

7. The signal predistortion method of claim 6, wherein the second filtering process is a high-pass filtering process.

8. The signal predistortion method of claim 6, further comprising:

generating, by the signal processing circuit, the out-of-band predistortion parameter set.

9. The signal predistortion method of claim 8, wherein the transmission device further comprises a loopback path, and generating the out-of-band predistortion parameter set comprises:

inputting the in-band predistortion output into the transmission chain, wherein the transmission chain generates a second input signal according to the in-band predistortion output, the power amplifier amplifies the second input signal to generate a second output signal, and the loopback path generate a second loopback signal according to the second output signal; and determining the out-of-band predistortion parameter set according to the in-band predistortion output and the second loopback signal.

10. The signal predistortion method of claim 9, wherein determining the out-of-band predistortion parameter set according to the in-band predistortion output and the second loopback signal comprises:

generating a second reference signal according to the in-band predistortion output and a second reference parameter set;

processing the second loopback signal and the second reference signal to generate a second adjustment signal;

modifying the second reference parameter set according to the second adjustment signal to minimize the second adjustment signal; and using the modified second reference parameter set that minimizes the second adjustment signal as the out-of-band predistortion parameter set.

11. A transmission device, comprising:

a signal processing circuit comprising:

an in-band predistortion circuit configured to perform a first signal processing operation on a baseband signal and an in-band predistortion parameter set, to generate an in-band predistortion output;

an in-band predistortion calibration circuit configured to generate the in-band predistortion parameter set according to a difference between a first reference signal and the baseband signal;

an out-of-band predistortion circuit configured to perform a second signal processing operation on the in-band predistortion output, to generate an out-of-band predistortion output; and a first computation circuit configured to generate a full-band predistortion signal according to the in-band predistortion output and the out-of-band predistortion output;

a transmission chain configured to generate a radio-frequency (RF) input signal according to the full-band predistortion signal; and a power amplifier configured to amplify the RF input signal to generate a RF output signal.

12. The transmission device of claim 11, wherein the in-band predistortion circuit comprises:

an in-band predistorter configured to perform an in-band predistortion process on the baseband signal according to the in-band predistortion parameter set, to generate a first predistortion output; and a first filter configured to perform a first filtering process on the first predistortion output, to generate the in-band predistortion output, wherein the first filtering process is a low-pass filtering process.

13. The transmission device of claim 12, wherein the transmission device further comprises a loopback path;

wherein the transmission chain is configured to generate a first input signal according to the baseband signal, the power amplifier is configured to amplify the first input signal to generate a first output signal, and the loopback path is configured to generate a first loopback signal according to the first output signal; and wherein the in-band predistortion calibration circuit is configured to determine the in-band predistortion parameter set according to the baseband signal and the first loopback signal.

14. The transmission device of claim 13, wherein the in-band predistortion calibration circuit comprises:

an in-band predistortion parameter training circuit configured to generate the first reference signal according to the first loopback signal and a first reference parameter set; and a second computation circuit configured to generate a first adjustment signal based on the difference between the first reference signal and the baseband signal, wherein the in-band predistortion parameter training circuit is further configured to modify the first reference parameter set according to the first adjustment signal, so that the first reference signal approximates the baseband signal and is further configured to use the modified first reference parameter set making the first reference signal substantially equal to the baseband signal as the in-band predistortion parameter set.

15. The transmission device of claim 11, wherein the out-of-band predistortion circuit comprises:

an out-of-band predistorter configured to perform an out-of-band predistortion process on the in-band predistortion output according to an out-of-band predistortion parameter set, to generate a second predistortion output; and a second filter configured to perform a second filtering process on the second predistortion output, to generate the out-of-band predistortion output, wherein the second filtering process is a high-pass filtering process.

16. The transmission device of claim 15, wherein the signal processing circuit further comprises an out-of-band predistortion calibration circuit, and the signal processing circuit configured to generate the out-of-band predistortion parameter set by the out-of-band predistortion calibration circuit.

17. The transmission device of claim 16, wherein the transmission device further comprises a loopback path;

wherein the transmission chain is configured to generate a second input signal according to the in-band predistortion output, the power amplifier is configured to amplify the second input signal to generate a second output signal, and the loopback path is configured to generate a second loopback signal according to the second output signal; and wherein the out-of-band predistortion calibration circuit is configured to determine the out-of-band predistortion parameter set according to the in-band predistortion output and the second loopback signal.

18. The transmission device of claim 17, wherein the out-of-band predistortion calibration circuit comprises:

an out-of-band predistortion parameter training circuit configured to generate a second reference signal according to the in-band predistortion output and a second reference parameter set;

a third filter configured to perform a third filtering process on the second loopback signal and the second reference signal to generate a filtered second loopback signal and a filtered second reference signal; and a third computation circuit configured to generate a second adjustment signal according to a sum of the filtered second loopback signal and the filtered second reference signal, wherein the out-of-band predistortion parameter training circuit is further configured to modify the second reference parameter set according to the second adjustment signal to minimize the second adjustment signal and is further configured to use the modified second reference parameter set that minimizes the second adjustment signal as the out-of-band predistortion parameter set.

* * * * *